US006372584B1

(12) United States Patent
Yu

(10) Patent No.: US 6,372,584 B1
(45) Date of Patent: Apr. 16, 2002

(54) METHOD FOR MAKING RAISED SOURCE/DRAIN REGIONS USING LASER

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/628,382

(22) Filed: Aug. 1, 2000

(51) Int. Cl.⁷ ............................................. H01L 21/336
(52) U.S. Cl. ........................ 438/300; 438/296; 438/303
(58) Field of Search ................................. 438/300, 151, 438/296, 303, 166

(56) References Cited

U.S. PATENT DOCUMENTS

| 5,817,550 A | * | 10/1998 | Carey et al. ................. 438/166 |
| 5,824,586 A | * | 10/1998 | Wollesen et al. ............ 438/300 |
| 5,892,246 A | * | 4/1999 | Tsai et al. ....................... 257/66 |
| 5,953,615 A | * | 9/1999 | Yu ................................. 438/303 |
| 5,955,759 A | * | 9/1999 | Ismail et al. ................. 257/332 |
| 6,022,781 A | * | 2/2000 | Noble, Jr. et al. ........... 438/296 |
| 6,071,762 A | * | 6/2000 | Wu et al. ..................... 438/151 |
| 6,072,454 A | * | 6/2000 | Nakai et al. ................... 345/97 |
| 6,110,787 A | * | 8/2000 | Chan et al. .................. 438/300 |

* cited by examiner

Primary Examiner—John F. Niebling
Assistant Examiner—Walter L. Lindsay, Jr.
(74) Attorney, Agent, or Firm—LaRiviere, Grubman & Payne, LLP

(57) ABSTRACT

A low thermal budget method for making raised source/drain regions in a semiconductor device includes covering a silicon substrate and gate stacks with an amorphous silicon film, and then melting the film using a laser to crystallize the silicon. Subsequent dopant activation and silicidization are undertaken to render a raised source/drain structure while minimizing the thermal budget of the process.

7 Claims, 2 Drawing Sheets

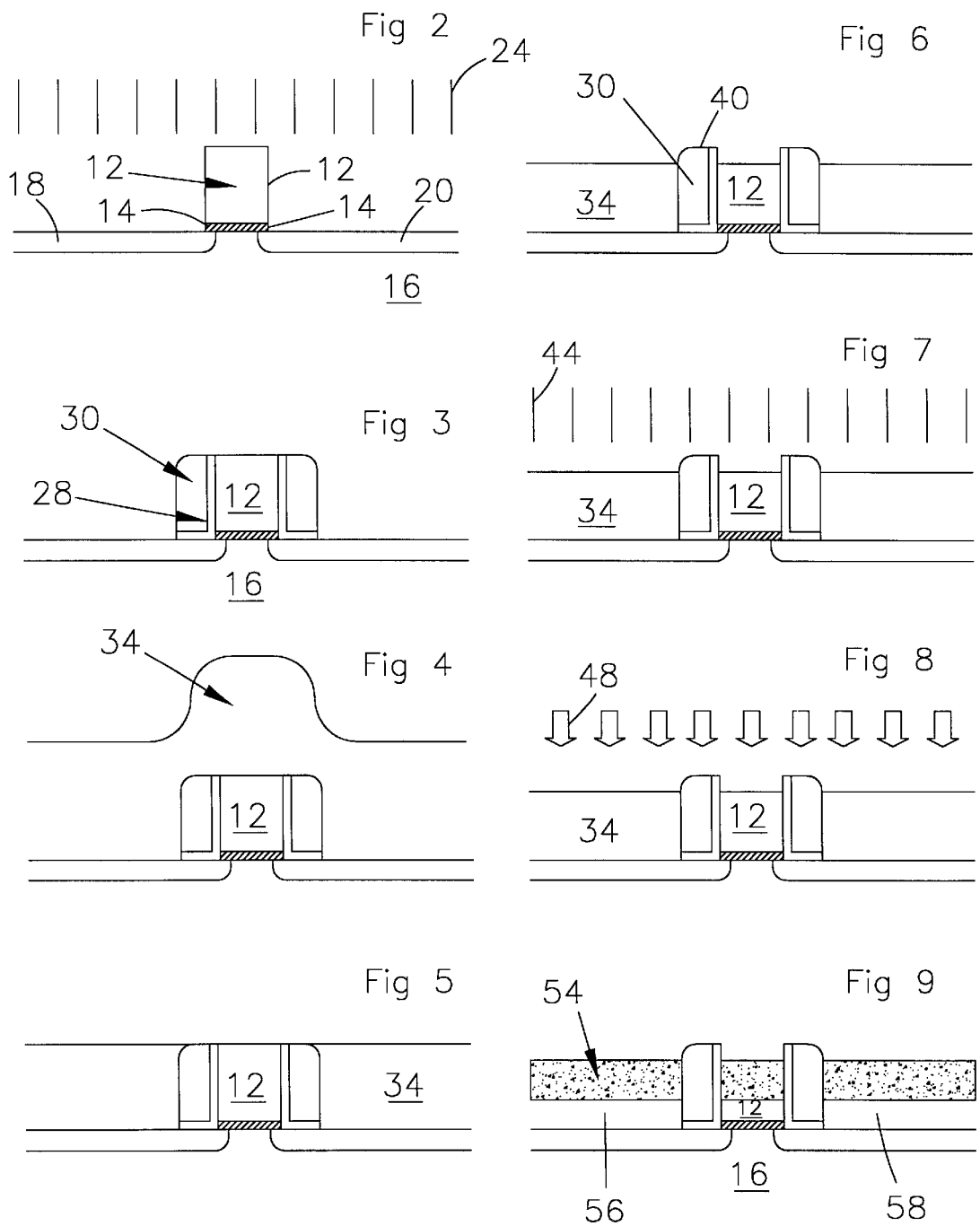

METHOD FOR MAKING RAISED SOURCE/ DRAIN REGIONS USING LASER

TECHNICAL FIELD

The present invention relates generally to semiconductor fabrication, and more particularly to methods for fabricating improved ultra-large scale integration (ULSI) semiconductor devices including ULSI metal oxide silicon field effect transistors (MOSFETs).

BACKGROUND OF THE INVENTION

Semiconductor chips or wafers are used in many applications, including use as processor chips for computers, use as integrated circuits, and use as flash memory for hand-held computing devices, wireless telephones, and digital cameras. Regardless of the application, a semiconductor chip desirably holds as many circuits or memory cells as possible per unit area. In this way, the size, weight, and energy consumption of devices using semiconductor chips advantageously is minimized, while, nevertheless, improving the memory capacity and computing power of the devices.

A common circuit component of semiconductor chips is the transistor. In ULSI semiconductor chips, a transistor is established by forming a polysilicon gate on a silicon substrate, and then forming a source region and a drain region side by side in the substrate beneath the gate by implanting appropriate dopant materials into the areas of the substrate that are to become the source and drain regions. The gate is insulated from the source and drain regions by a thin gate oxide layer, with small portions of the source and drain regions, referred to as "extensions," extending toward and virtually under the gate. This generally-described structure cooperates to function as a transistor.

MOSFETs having so-called "raised" source and drain regions have been provided, in which the source and drain regions extend above the surface of the substrate alongside the gate stack. Such structures advantageously exhibit less source/drain junction series resistance and provide more room for silicidation than conventional MOSFET structures, thereby improving transistor performance.

Epitaxy has been used to form the raised source/drain structure. As recognized herein, the epitaxial process entails the use of relatively high temperatures. The amount of heat used to make semiconductors is colloquially referred to as the "thermal budget" of a process. Minimizing the thermal budget is important, because a high thermal budget can cause unwanted side effects, such as dopant diffusion into well regions and into channel implant regions and warping of the chip. With the foregoing background in mind, the present invention recognizes the desirability of minimizing the thermal budget in a raised source/drain semiconductor chip fabrication process.

BRIEF SUMMARY OF THE INVENTION

A method is disclosed for establishing one or more raised source/drain regions on a semiconductor substrate. The method includes forming at least one gate stack on the substrate, and then disposing an amorphous silicon film over the substrate and gate stack. The film is polished down to the top surface of the gate stack and further is etched away after polishing. Dopant is then implanted into the film, and the film is irradiated with an excimer laser melt at least portions of the film and crystallize the silicon. After irradiating, annealing is undertaken to silicidize the film and activate the dopant in the film to thereby establish raised source/drain regions.

In another aspect, a method for establishing one or more raised source/drain regions on a semiconductor substrate includes disposing an amorphous silicon film on the substrate, and irradiating the film with laser light to melt at least portions of the film.

Other features of the present invention are disclosed or apparent in the section entitled "DETAILED DESCRIPTION OF THE INVENTION."

BRIEF DESCRIPTION OF DRAWINGS

For fuller understanding of the present invention, reference is made to the accompanying drawings in the section headed Detailed Description of the Invention. In the drawings:

FIG. 2 is a side view of the device processed by the steps shown in FIG. 1 after gate stack formation, during source/drain extension dopant implantation, in accordance with the present invention;

FIG. 3 is a side view of the device after forming a protective nitride sidewall layer, in accordance with the present invention;

FIG. 4 is a side view of the device after deposition of amorphous silicon, in accordance with the present invention;

FIG. 5 is a side view of the device after polishing of the amorphous silicon, in accordance with the present invention;

FIG. 6 is a side view of the device after etching of the amorphous silicon and gate, in accordance with the present invention;

FIG. 7 is a side view of the device during source/drain dopant implantation, in accordance with the present invention;

FIG. 8 is a side view of the device during laser melting, in accordance with the present invention; and FIG. 9 is a side view of the device after silicidation and dopant activation, in accordance with the present invention.

Figure 1:
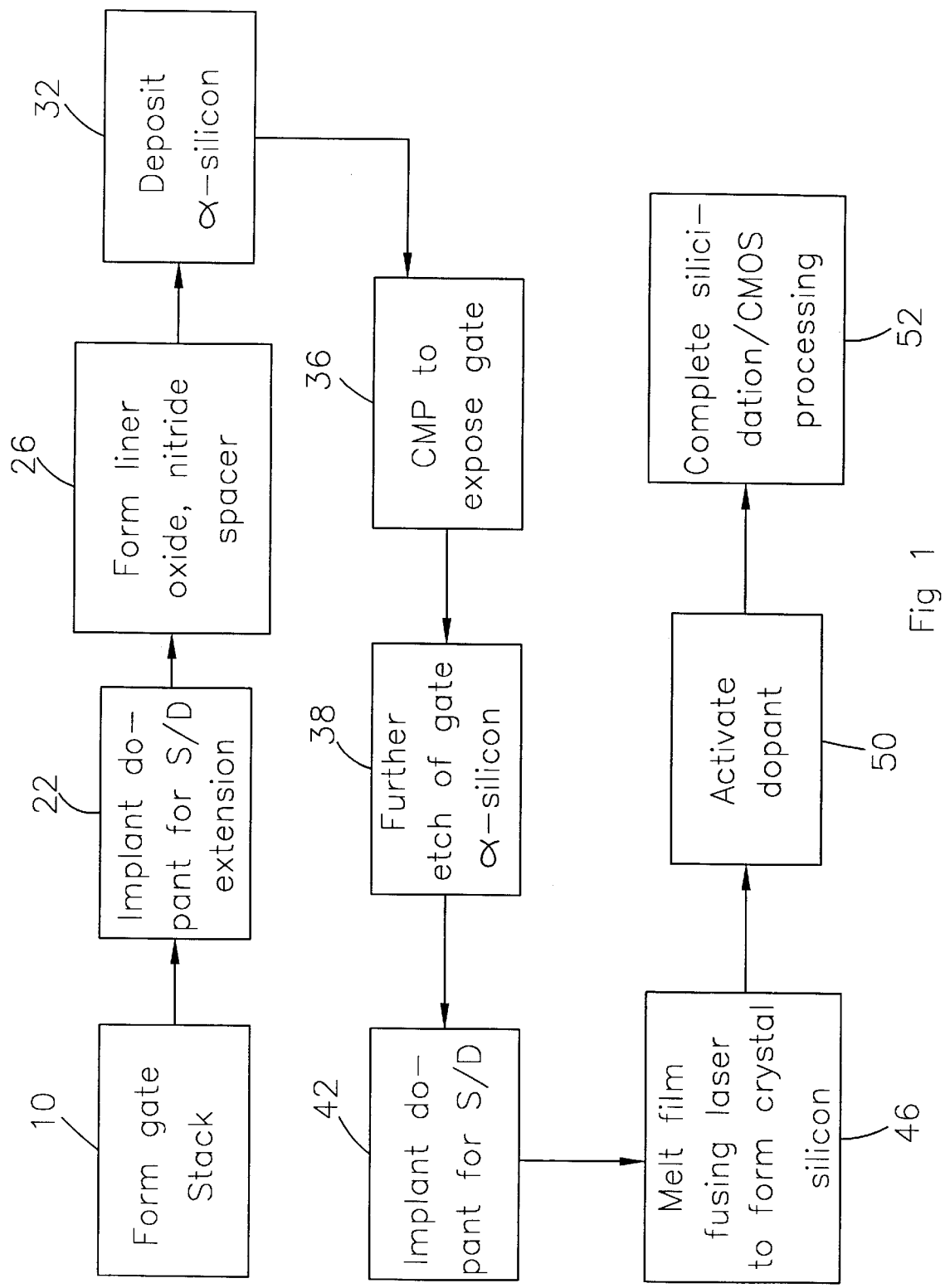
FIG. 1 is a flow chart showing the steps of the present invention for establishing raised source/drain regions.

Reference numbers refer to the same or equivilant parts of the present invention throughout the several figures of the drawings.

DETAILED DESCRIPTION OF THE INVENTION

Referring initially to FIG. 1, as indicated at block 10 and as shown in FIG. 2, gate stacks 12 including polysilicon (only a single gate stack 12 shown for clarity) are conventionally formed on a gate oxide layer 14, which in turn is formed on semiconductor substrate 16. The gate stack 12 can be, for example, one thousand to fifteen hundred Angstroms (1000 Å–1500 Å) thick, and the oxide layer 14 can be, for example, twelve to twenty Angstroms (12 Å–20 Å) thick. The substrate 16 includes regions 18, 20 which are to become portions of the source and drain extension regions of a MOSFET, according to the present invention. At block 22, an appropriate dopant 24 is implanted into the extension regions 18, 20 and the gate stack 12.

Moving to block 26 and referring to FIG. 3, an oxide liner 28 is grown or otherwise formed on the sides of the gate stack 12 and on the substrate 16, and then a nitride sidewall spacer 30 is formed over the oxide liner 28. The liner 28 can be, for example, one hundred to two hundred Angstroms (100 Å–200 Å) wide, and the nitride spacer 30 can be, for example, six hundred to nine hundred Angstroms (600 Å–900 Å) wide.

Proceeding to block 32, amorphous silicon film 34 is deposited over the structure described above, as shown in FIG. 4. Preferably, the α-silicon film 34 is between three thousand to five thousand Angstroms (3000 Å–5000 Å) thick, and is deposited by, for example, chemical vapor deposition.

At block 36, the α-silicon film 34 is removed down to the top of the gate stack 12, as shown in FIG. 5. In one preferred and non-limiting embodiment, this removal is accomplished by chemical mechanical polishing (CMP), although other removal techniques such as etching can be used.

Next, at block 38 about two hundred to three hundred Angstroms (200 Å–300 Å) of material in the thickness dimension can be removed, if desired, from both the film 34 and polysilicon gate stack 12 by, for example, wet etching, as best shown in FIG. 6. As shown, after etching a barrier portion 40 of the nitride sidewall spacer 30 (and a contiguous portion of the oxide liner 28) protrude above the gate stack 12/film 34 surface preferably by about two hundred to three hundred Angstroms (200 Å–300 Å). As intended by the present invention, the barrier portion 40 prevents diffusion of material between the film 34 and gate stack 12 during the subsequent process steps disclosed below.

Moving to block 42, appropriate dopant 44 (FIG. 7) is implanted into the film 34 and gate stack 12. Then, in accordance with the present invention, at block 46 the α-silicon film 34 is melted using an excimer laser beam, labeled 48 in FIG. 8. This recrystallizes the film 34 into crystal silicon. In one preferred embodiment, the laser 48 is a 308 nm wavelength laser that can be pulsed, to minimize the thermal budget of the process.

Next, at block 50 of FIG. 1 and as shown in FIG. 9, the source/drain dopant is activated, preferably by high temperature rapid thermal annealing (RTA) in a temperature range such as 1000° C.–100° C. At block 52 the silicidizing process is completed, establishing a silicide film 54 over the gate stack 12 and over raised source and drain regions 56, 58 that are located above the substrate 16. Conventional CMOS semiconductor fabrication techniques including low pressure chemical vapor deposition (LPCVD) can be used to complete fabrication of the MOSFET by forming contacts, interconnects, etc. It is to be understood that the principles disclosed herein can also be used for thin film deposition applications such as nitride deposition and polysilicon deposition in integrated circuit and microsensor fabrication.

While the particular METHOD FOR MAKING RAISED SOURCE/DRAIN REGIONS USING LASER, as herein shown and described in detail, is fully capable of attaining the above-described objects of the invention, be it understood that such is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." Indeed, although a single transistor structure is shown in the drawings for clarity, the skilled artisan will appreciate that the chip 10 can include plural transistors, each substantially identical to that shown, as well as other circuit components. All structural and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims.

What is claimed is:

1. A method for establishing one or more raised source/drain regions on a semiconductor substrate, comprising:

disposing an amorphous silicon film on the substrate; and irradiating the film with laser light to melt at least portions of the film forming at least one gate stack on the substrate, the gate stack defining a top surface, and polishing the film down to the top surface.

2. The method of claim 1, wherein the irradiation act is undertaken using an excimer laser.

3. The method of claim 1, further comprising implanting dopant into the film.

4. The method of claim 3, further comprising activating the dopant, after the irradiating act, to thereby establish raised source/drain regions.

5. The method of claim 1, further comprising etching away portions of the film after the polishing act.

6. The method of claim 1, further comprising annealing the substrate after the irradiating act to silicidize at least portions of the film.

7. A method for establishing one or more raised source/drain regions on a semiconductor substrate, comprising:

forming at least one gate stack on the substrate, the gate stack defining a top surface;

disposing an amorphous silicon film over the substrate and gate stack;

polishing the film down to the top surface of the gate stack;

etching away portions of the film after the polishing act;

implanting dopant into the film;

irradiating the film with an excimer laser melt at least portions of the film;

annealing the substrate after the irradiation act to silicidize at least portion of the film; and activating the dopant to thereby establish raised source/drain regions.

* * * * *

UNITED STATES PATENT AND TRADEMARK OFFICE
CERTIFICATE OF CORRECTION

PATENT NO.    : 6,372,584 B1
DATED         : April 16, 2002
INVENTOR(S)   : Bin Yu It is certified that error appears in the above-identified patent and that said Letters Patent is hereby corrected as shown below:

<u>Column 3,</u>
Line 36, after "1000° C-" delete "100°" and replace with -- 1100° --.

<u>Column 4,</u>
Line 26, delete "irradiation" and replace with -- irradiating --.
Line 51, delete "irradiation" and replace with -- irradiating --.

Signed and Sealed this

Fourth Day of June, 2002

*Attest:*

*Attesting Officer*

JAMES E. ROGAN
*Director of the United States Patent and Trademark Office*